United States Patent
Chakradhar et al.

(10) Patent No.: US 6,378,096 B1
(45) Date of Patent: Apr. 23, 2002

(54) ON-LINE PARTITIONING FOR SEQUENTIAL CIRCUIT TEST GENERATION

(75) Inventors: Srimat T. Chakradhar, Old Bridge; Kiran B. Doreswamy, Princeton, both of NJ (US); Surendra K. Bommu, Marlboro, MA (US); Xijiang Lin, Iowa City, IA (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/389,591

(22) Filed: Sep. 3, 1999

Related U.S. Application Data
(60) Provisional application No. 60/116,583, filed on Jan. 20, 1999.

(51) Int. Cl.$^7$ ................................................ G06F 11/00
(52) U.S. Cl. ...................................... 714/738; 714/724
(58) Field of Search ............................... 714/738, 724, 714/739

(56) References Cited

U.S. PATENT DOCUMENTS

| | | | |
|---|---|---|---|
| 5,559,811 A | * | 9/1996 | Abramovici et al. |
| 5,657,240 A | * | 8/1997 | Chakradhar et al. |
| 5,875,196 A | * | 2/1999 | Chakradhar et al. |
| 6,163,867 A | * | 12/2000 | Miller et al. |

\* cited by examiner

*Primary Examiner*—Phung M. Chung
(74) *Attorney, Agent, or Firm*—Sughrue Mion, PLLC

(57) ABSTRACT

A method of solving a test generation problem for sequential circuits is disclosed. The method comprises recursively dividing an original test generation problem into smaller problems, wherein said sub-problems may be dependent while one or more of said dependent sub-problems may have solution-specific independence, finding solutions for said sub-problems, reusing solutions for dependent sub-problems, whenever the dependent sub-problems enjoy solution-specific independence; and identifying a minimal subset of conflicting objectives if a sub-problem that has to be solved to achieve multiple objectives has no solution. A test generation system comprising a computer, said computer having a cpu and memory, said memory comprising instructions capable of implementing components of said system. The components comprise a test generation problem solver that recursively solves test generation problems wherein solutions for sub-problems are reused, a problem partitioner that receives test generation problems and partitions said test generation problems into sub-problems wherein said sub-problems may be dependent and wherein said sub-problems may have solution-specific dependence, a consistent label checker that receives the test generation problem from the problem solver and determined if there is consistent labeling, a partition merger that merges a subset of sub-problems if no solution exists for said subset of sub-problems and if said subset of sub-problems are dependent and a conflict set generator that generates a conflict set of objectives that prevents a specific sub-problem from having a solution.

5 Claims, 17 Drawing Sheets

FIG. 23

| Ckt | Total | Baseline System | | | On-Line partitioning | | | Percent Improvement | | |
|---|---|---|---|---|---|---|---|---|---|---|
| | | Solved | Bt | Time | Solved | Bt | Time | Solved | Bt | Time |
| s208 | 208 | 204 | 1267 | 13 s | 208 | 232 | 5 s | 1 | 81 | 61 |
| s298 | 282 | 242 | 66287 | 456 s | 279 | 8880 | 206 s | 15 | 86 | 54 |
| s344 | 300 | 278 | 17886 | 265 s | 300 | 1252 | 9 s | 7 | 93 | 96 |
| s349 | 308 | 286 | 17638 | 265 s | 308 | 1254 | 9 s | 7 | 92 | 96 |
| s382 | 331 | 89 | 80110 | 2764 s | 145 | 57625 | 2715 s | 62 | 28 | 1 |
| s386 | 368 | 327 | 83596 | 706 s | 354 | 73315 | 629 s | 8 | 12 | 10 |
| s400 | 332 | 116 | 90908 | 2656 s | 151 | 57028 | 2650 s | 30 | 37 | 0 |
| s420 | 402 | 381 | 46780 | 135 s | 400 | 2347 | 27 s | 4 | 94 | 80 |
| s444 | 411 | 157 | 216520 | 3328 s | 203 | 147272 | 3298 s | 29 | 31 | 0 |
| s526 | 402 | 97 | 75450 | 3440 s | 137 | 39005 | 3371 s | 41 | 48 | 2 |
| s526n | 407 | 102 | 79275 | 3493 s | 135 | 38372 | 3349 s | 32 | 51 | 4 |
| s820 | 842 | 324 | 179100 | 3318 s | 349 | 132888 | 4315 s | 7 | 25 | -30 |
| s832 | 862 | 301 | 160102 | 4606 s | 368 | 100628 | 5280 s | 22 | 37 | -14 |
| s838 | 780 | 740 | 88136 | 264 s | 772 | 6003 | 135 s | 4 | 93 | 48 |
| s1423 | 1276 | 349 | 347960 | 9380 s | 464 | 146533 | 9677 s | 32 | 57 | -3 |
| s1488 | 1173 | 563 | 209374 | 6246 s | 478 | 140312 | 7454 s | -15 | 32 | -19 |
| s1494 | 1494 | 586 | 331484 | 9197 s | 640 | 173460 | 8666 s | 9 | 47 | 5 |
| s5378 | 4108 | 3016 | 533601 | 8323 s | 3701 | 314709 | 8553 s | 22 | 41 | -2 |
| s13207 | 8341 | 8308 | 11394 | 406 s | 8328 | 3620 | 391 s | 0 | 68 | 3 |
| s35932 | 35030 | 33354 | 57034 | 74930 s | 34329 | 6793 | 20643 s | 2 | 88 | 72 |
| s38417 | 27946 | 2562 | 1896502 | 282456 s | 2742 | 2306716 | 287682 s | 7 | -21 | -1 |

Total: Total number of problems attempted by ATPG
Solved: Total number of problems solved by ATPG
Time: Execution time (seconds)
Bt: Total backtracks incurred by ATPG

FIG. 24

| Ckt | Total | Baseline system | | | On-Line partitioning | | | Percent Improvement | | |
|---|---|---|---|---|---|---|---|---|---|---|
| | | Solved | Bt | Time | Solved | Bt | Time | Solved | Bt | Time |
| ckt1 | 8710 | 8356 | 211032 | 3813 s | 8468 | 64224 | 2661 s | 1 | 69 | 30 |
| ckt2 | 8710 | 8325 | 200143 | 3925 s | 8437 | 52346 | 2681 s | 1 | 73 | 31 |
| ckt3 | 7242 | 6689 | 258979 | 5157 s | 6870 | 134960 | 3584 s | 2 | 47 | 30 |
| ckt4 | 7242 | 6685 | 260784 | 5630 s | 6870 | 132918 | 3893 s | 2 | 49 | 30 |
| ckt5 | 12163 | 11149 | 461438 | 4198 s | 12027 | 232886 | 4371 s | 7 | 49 | -4 |
| ckt6 | 12163 | 11145 | 459575 | 4189 s | 12030 | 232550 | 4410 s | 7 | 49 | -5 |

Total: Total number of problems attempted by ATPG
Solved: Total number of problems solved by ATPG
Time: Execution time (seconds)
Bt: Total backtracks incurred by ATPG

FIG. 25

Algorithm 1 ONLINE_SOLVE (C)
Input: Problem C
Output: Solution $S_C \leftarrow$ {YES, NO}. If no solution, provide a conflicting subset of initial objectives.
1: $S_C \leftarrow$ YES ; conflict_set $\leftarrow$ NULL
2: if ($v \leftarrow$ NEXT_DECISION_VARIABLE (C)) then
3:     $S_C \leftarrow$ NO
4:     while ($V_{value} \leftarrow$ NEXT_VALUE (v)) do
5:         ($S_C$, conflict_set) $\leftarrow$ CONSISTENT_LABELING (C)
6:         if ($S_C$ = YES) then
7:             P $\leftarrow$ PARTITION (C)
8:             while ($P_i \leftarrow$ NEXT_UNSOLVED_PARTITION (P)) do
9:                 ($S_C$, conflict_set) $\leftarrow$ ONLINE_SOLVE ($P_i$)
10:               if ($S_C$ == NO) then
11:                   if (DEPENDENT_PARTITION ($P_i$, P, conflict_set)) then
12:                       P $\leftarrow$ MERGE_PARTITIONS ($P_i$, P)
13:                   else
14:                       break/* No solution possible with $V_{value}$. Try next value. */
15:                   end if
16:               end if
17:             end while
18:         end if
19:         if ($S_C$ == YES or VARIABLE_INDEPENDENT_PARTITION (conflict_set, v)) then
20:             break/* Either problem C is solved or no solution possible for any value of v*/
21:         end if
22:     end while
23: end if
24: return ($S_C$, conflict_set)

FIG. 26

Algorithm 2 IMPLEMENTATION_OF_ONLINE_SOLVE($C$)

Input: Problem $C$
Output: Solution $S_C \leftarrow$ {YES, NO}

1: $S_C \leftarrow$ YES ; *conflict* $\leftarrow$ NO;
2: *conflicting_values* $\leftarrow$ NULL ; *dep_partitions* $\leftarrow$ NULL
3: loop
4:    if *conflict* == NO then
5:       if ($v \leftarrow$ NEXT_DECISION_VARIABLE( *Stack*, *Merged_partition$_{db}$* )) then
6:          $V_{value} \leftarrow$ FIRST_VALUE($v$)
7:          PUSH ($v$, *Stack*)
8:       else
9:          break/*Problem is SOLVED*/
10:       end if
11:    else
12:       ($S_C$, *dep_partitions*) $\leftarrow$ BACKTRACK (*conflict_values*)
13:       if $S_C$ == NO then
14:          break/* Problem is UNSOLVABLE*/
15:       end if
16:       MERGE_PARTITIONS(*Merged_partition$_{db}$*, *dep_partitions*)
17:       $V_{value} \leftarrow$ NEXT_VALUE($v \leftarrow$ TOP (*Stack*))
18:    end if
19:    SET_VALUE(V, $V_{value}$)
20:    ADD_TO_PARTITION_DB ( *partition$_{db}$*, *dep_partitions*)
21:    (*conflict*, *conflict_values*) $\leftarrow$ CONSISTENT_LABELING($C$)
22: end loop
23: return ($S_C$, *dep_partitions*)

FIG. 27

| Algorithm 3 BACKTRACK (*conflicting_values*) |
|---|

Input: Set of values that are conflicting
Output: {YES, NO}, *and dependent partitions*
 1: if EMPTY (*Stack*) then
 2:   return (NO, NULL)
 3: end if
 4: *partitions* = DEPENDENT_PARTITIONS( *partition$_{db}$* , *conflicting_values* )
 5: *mrp* ← MOST_RECENT_ *PARTITION* (*Stack, partitions*)
 6: if (no *mrp*) then
 7:   return (NO, NULL)
 8: end if
 9: *PARTITION*_REUSE(*mrp*)
10: return (YES, PARTITIONS)

FIG. 28

Algorithm 4 PARTITION_REUSE (*mrp*)

Input: Most recent partition
Output: Partition solutions that do not depend on *mrp* are reused.

1: *partition_list* ← NULL
2: *delete_set* ← {*mrp*}
3: repeat
4:    *v* ← POP (*Stack*)
5:    if *v* ≠ *mrp* then
6:       *partition_list* ← *v* ∪ *partition_list*
7:    end if
8: until *v* == *mrp*
9: for all *w* ∈ *partition_list* do
10:    if (CHILD(*w*, *delete_set*, *partition*$_{db}$) or (ANCESTORS(*w*, *partition*$_{db}$)) ∈ *delete_set*) then
11:       *delete_set* ← *delete_set* ∪ *w*
12:    else
13:       PUSH (*w*, *stack*)
14:    end if
15: end for
16: for all *w* ∈ *delete_set* do
17:    UNSET_VALUE (*w*)
18:    DELETE_FROM_*PARTITION*_DATABASE (*w*, *partition*$_{db}$)
19: end for
20: PUSH (*mrp*, *Stack*)
21: return

ON-LINE PARTITIONING FOR SEQUENTIAL CIRCUIT TEST GENERATION

This application claims priority from U.S. Provisional Application Ser. No. 60/116,583, filed on Jan. 20, 1999, which is incorporated herein by reference.

DESCRIPTION OF THE INVENTION

IA. Field of the Invention

The present invention is related to solving complex problems. Specifically, the present invention is related to a method of solving a test generation problem for sequential circuits. The present invention is embodied in methods for solving a problem; methods for solving a test generation problem for sequential circuits; a method for generating test vectors for testing sequential circuits; systems for generating test vectors; and a computer program product including a computer code for solving a test generation problem for sequential circuits.

IB. Background of the Invention

Complex problems are often defined by a large set of constraints. Test generation for testing a sequential circuit is an example of such a complex problem. For some problems, the only practical method of obtaining a solution may be an on-line method. FIG. 20 shows a flowchart describing an on-line method. According to these on-line methods, a subset of constraints that correspond to a sub-problem of the main problem are first considered as shown in 20.1 and 20.2. A solution is derived for this sub-problem 20.3. Because such a solution for the sub-problem satisfies only a subset of constraints of the main problem, it is referred to as the partial solution. If no partial solution exists for the sub-problem, then it is clear that the main problem itself has no solution. In such a case a subset of constraints that prevent the existence of a solution is identified 20.4.

A check is made to see if a partial solution additionally satisfies all constraints of the main problem 20.5. In such a case, the partial solution itself is a complete solution to the main problem 20.6. Otherwise, if the partial solution does not satisfy additional constraints that are not part of the constraints corresponding to the sub-problem, an on line method augments the subset of constraints for the sub-problem. This is done by including one or more of the additional constraints 20.7. After augmentation, the on-line method derives another partial solution. This process is repeated, as shown in the loop of FIG. 20, until either a partial solution that satisfies all constraints is derived or a subset of constraints is identified that does not have a partial solution. Usually, either a solution is found or it is established that no solution is possible well before the final iteration that will have to consider all constraints.

An example of an on-line method is the conventional time-frame expansion method. Consider solving the sequential test generation problem using the conventional time-frame expansion method. The time frame expansion method is described in detail in the following references: G. R. Puzzle and J. P. Both, "A Heuristic Algorithm for the Testing of Asynchronous Circuits," *IEEE Trans. on Computers*, pp. 639–647, June 1971; R. Marlene, "An Efficient Test Generation System for Sequential Circuits," 23*Rd. Design Automation Conference*, June 1986, pp. 250–256; H-K. T. Ma, et. Al., "Test Generation for Sequential Circuits," *IEEE Trans. on Computer-Aided Design*, Vol. 7, No. 10, pp. 1081–1093, October 1988; M. Scull and E. Auto, "ESSENTIAL: An Efficient Self-Learning Test Pattern Generation Algorithm For Sequential Circuits," 1989 *International Test Conference*, pp. 28–37; W. Chewing and T. Chakraborty, "Gentest—An Automatic Test Generation System for Sequential Circuits," *IEEE Computer* pp. 43–49, April 1989, D. H. Lee and S. M. Reddy, "A New Test Generation Method for Sequential circuits," *Proc. of International Conference on Computer Aided Design*, pp. 446–449, 1991; T. Niermann and J. Patel, "HITEC: A Test Generation Package for Sequential Circuits," *European Conf. On Design Automation* 1991, pp. 214–218 and T. Kelsey, K. Saluja, and S. Lee, "An Efficient Algorithm for Sequential Circuit Test Generation," *IEEE Trans. on Computer*, vol. 42, pp. 1361–1371, November 1993.

In the time-frame expansion method, a test generation problem for sequential circuits is divided into sub-problems. A different sub-problem is identified with each time-frame. These sub-problems are not independent. The dependencies between sub-problems exist because, for any given time-frame, there are constraints on combination of values that can (or cannot) be assumed by state variable inputs. However, explicitly determining all constraints imposed on a time-frame by neighboring time-frames is also difficult. Further, such a determination may be as hard as solving the original test generation problem. This is because prohibitive computational resources may be required to determine all legal and illegal combination of state variable values. Furthermore, the number of sub-problems (time-frames) that will have to be considered for a target fault may not be known. Instead, a partial solution for a sub-problem (corresponding to a time-frame) is determined by ignoring constraints imposed by neighboring time-frames. Such a partial solution may not satisfy an ignored constraint (for example, the partial solution may require a present state that cannot be justified). Adding the unsatisfied constraints augments the initial constraints set for the sub-problem, and thus deriving a new partial solution. Clearly, the time-frame expansion technique employed by sequential test generators is an on-line method.

In other word, on-line methods derive a solution by solving a series of related problems $P_1 \ldots, P_n$ where:

(1) the constraint set that defines problem $P_i (1 \leq i \leq n-1)$ is a subset of the constraint set for problem $P_{i+1}$, and (2) constraints for problem $P_{i+1}$ are usually not known while deriving a solution for problem $P_i$.

If an algorithm is available for finding a solution for $P_1$, one can repeatedly use the same algorithm for deriving solutions for problems $P_2, \ldots, P_n$ by considering each $P_i$ ($1 \leq i \leq n$) as independent problems. However, this typically is not an efficient way of finding a solution using on-line methods.

Many problems are often solved by recursively partitioning the problem into sub-problems. Partitioning implies that:

(1) sub-problems can be solved independently, and (2) solutions to sub-problems can be put together to derive a solution for the original problem.

Sub-problems are independent if the search spaces that will have to be examined for finding sub-problem solutions are independent. However, it should be clear that mandating independence of sub-problems could result in a sub-problem that may be as large as the original problem.

Practitioners in this field know that using recursive partitioning for on-line methods presents additional complications. Even if manageable and independent partitions can be derived for problem $P_i$, these partitions may not be independent for problem $P_{i+1}$. This is because additional constraints included in problem $P_{i+1}$ can cause independent sub-problems in $P_i$ to now become dependent.

II. SUMMARY OF THE INVENTION

It is an object of the present invention to provide an improved on-line problem solving method without the above-mentioned problems. It is a specific objective of the present invention to provide an on-line method of solving a test generation problem for sequential circuit wherein partitioned sub-problems can be dependent. It is another specific objective of the present invention to provided an improved method of generating test vectors for testing a sequential circuit.

In order to meet the objects of the present invention there is provided a method of solving a test generation problem for sequential circuits comprising: recursively dividing an original test generation problem into smaller sub-problems, wherein said sub-problems may be dependent while one or more of said dependent sub-problems may have solution-specific independence; finding solutions for said sub-problems: reusing solutions for dependent sub-problems, whenever the dependent sub-problems enjoy solution-specific independence; and identifying a minimal subset of conflicting objectives if a sub-problem that has to be solved to achieve multiple objectives has no solution.

Another aspect of the present invention is a method of generating test vectors for testing a sequential circuit, said method comprising: identifying a test generation problem; selecting a next decision variable; selecting a next value for the decision variable; checking to see if the value selected leads to consistent labeling and returning a conflict set if consistent labeling does not exist; performing the following three sub-steps if said checking finds consistent labeling: partitioning the test generation problem into sub-problems and recursively applying the method of this claim to each of said sub-problems; merging dependent partitions if no solution exists for a current sub-problem and if said dependent partitions exist; exiting if no solution exists for a current subproblem and if dependent partitions do not exist. After performing the above sub-steps, adding variables causing inconsistent labeling if said variables are not part of current partition if said checking leads to inconsistent labeling; repeating for all values of selected variable; repeating for all variables; and returning if solution is found or returning an identified conflict set.

Another aspect of the present invention is a method of solving a problem, said method comprising: recursively dividing the problem into smaller sub-problems, wherein said sub-problems may be dependent while one or more of said dependent sub-problems may have solution-specific independence; finding solutions for said sub-problems; reusing solutions for dependent sub-problems, whenever the dependent sub-problems enjoy solution-specific independence; and identifying a minimal subset of conflicting objectives if a sub-problem that has to be solved to achieve multiple objectives has no solution.

Another aspect of the present invention is a test generation system comprising a computer, said computer having a CPU and memory, said memory comprising instructions capable of implementing components of said system, said components comprising: a test generation problem solver for recursively solving test generation problems wherein solutions for sub-problems are reused: a problem partitioner for receiving test generation problems and partitioning said test generation problems into sub-problems wherein said sub-problems may be dependent and wherein said sub-problems may have solution-specific dependence; a consistent label checker for receiving the test generation problem from the problem solver and determining if there is consistent labeling; a partition merger for merging a subset of sub-problems if no solution exists for said subset of sub-problems and if said subset of sub-problems are dependent; and a conflict set generator for generating a conflict set of objectives that prevents a specific sub-problem from having a solution.

Yet another aspect of the present invention is a computer program product including a compute readable medium with instructions said instruction enabling a computer to solve a test generation problem, said instruction comprising: a test generation problem solver for enabling the computer to recursively solve the test generation problem, wherein solutions for sub-problems are reused; a problem partitioner code for enabling the computer to receive the test generation problem and partition said test generation problems into sub-problems wherein said sub-problems may be dependent and wherein said sub-problems may have solution-specific dependence; a consistent label checker code for enabling the computer to receive the test generation problem from the problem solver and determining if there is consistent labeling; a partition merger code for enabling a computer to merge a subset of sub-problems if no solution exists for said subset of sub-problems and if said subset of sub-problems are dependent; and a conflict set generator code for enabling a computer to generate a conflict set of objectives that prevents a specific sub-problem from having a solution.

III. BRIEF DESCRIPTION OF THE DRAWINGS

FIG. 23 shows Table 1 depicting on-line partitioning results for ISCAS benchmark circuits.

FIG. 24 shows Table 2 depicting on-line partitioning results for production circuits.

FIG. 25 shows a pseudo-code for a preferred embodiment of the test generation method according to the present invention.

FIG. 26 shows a pseudo-code for the most preferred embodiment of the test generation method according to the present invention.

FIG. 27 shows a pseudo-code for the BACKTRACK function used in the most preferred embodiment of the test generation method according to the present invention.

FIG. 28 shows a pseudo-code for the PARTITION_REUSE function used in the most preferred embodiment of the test generation method according to the present invention.

IV. DETAILED DESCRIPTION OF THE PREFERRED EMBODIMENTS

A new technique for solving problems that require on-line solution methods is provided. The technique of the present invention uses a novel on-line partitioning technique to:

(1) find a partial solution for a sub-problem, and (2) to recognize, formalize and exploit significant similarities that can exist between successive problems solved by the on-line method.

On-line partitioning differs from traditional partitioning in three significant ways:

(1) sub-problems do not have to be independent, (2) the problem is re-partitioned several times during the branch and bound search process, and (3) partitions are never explicitly computed.

Since sub-problems do not have to be independent, a complex problem can be divided into smaller, manageable sub-problems. In such a process, dependencies among partitions are recognized on the fly during the search process. Since the problem is re-partitioned after every decision in the search process, the cost of partitioning can be significant for large problems. However, it should be noted that explicit computation of all partitions is unnecessary. On-line partitioning retains the advantages of traditional partitioning:

(1) partial solutions for sub-problems can be easily combined to yield a solution for the entire problem, and (2) two or more identical sub-problems can share the same solution.

IVA. On-line Partition

Figure 1:
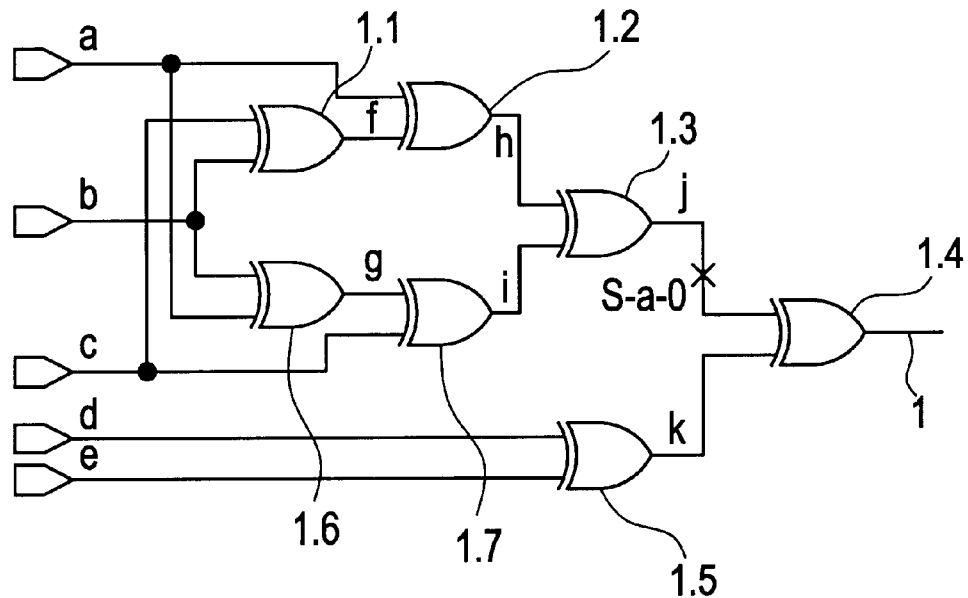
FIG. 1 shows an example of a circuit for illustrating static partitioning.

A first embodiment of the present invention is illustrated using the example circuit shown in FIG. 1. This circuit has five primary inputs: a, b, c, d and e. This circuit comprises 7 exclusive-OR gates 1.1–1.7. Signal 1 is the only primary output. The objective is to find a test for the stuck-at-0 fault on signal j. A stuck-at-0 fault indicates that the specific signal gets stuck with the value 0 regardless of the changes in the rest of the circuit. This problem is divided into two independent sub-problems: $S_1=\{a, b, c, f, g, h, i, j\}$ and $S_2=\{d, e, k\}$. The sub-objective for the sub-problem $S_1$ is to find values of inputs a, b, and c that cause signal j to assume the value 1. For the second sub-problem, the sub-objective is to find values of inputs d and e that will cause signal k to assume a value of 0 or 1. Solution to $S_1$ activates the fault. Solution to $S_2$ propagates the fault effect to the primary output 1. Note that $S_1$ and $S_2$ have no common signals. Therefore, the two sub-problems are independent. Clearly, in this embodiment the sub-problems are independent.

This partitioning of the test generation problem is known as static partitioning. Three advantages accrue from partitioning:

(1) if no solution exists for any of the sub-problems, then the fault is redundant, (2) sub-problems $S_1$ or $S_2$ need to be solved exactly once, and (3) sub-problem solutions can be trivially composed (put together) to yield a solution for the original problem.

For this example, values of primary inputs that satisfy objectives in sub-problems $S_1$ and $S_2$ are a test for the fault. Sub-problems can be solved in any order because they are independent problems. If a branch and bound procedure is used to solve $S_1$, then the procedure has to examine at most 8 combinations of values for signals a, b, and c. For this example, no solution exists for sub-problem $S_1$. The search procedure can incur at most 8 backtracks. Since no solution exists for $S_1$, the sub-problem $S_2$ does not have to be solved.

If no partitioning is used, then a branch and bound procedure for solving the original problem can be extremely inefficient. Consider again the problem of finding a test for the stuck-at-0 fault on signal j (FIG. 1). A solution can be determined by systematically examining various combinations of values for primary inputs. Assume that a branch and bound procedure is used to find a solution. All primary inputs are the decision variables. Assume that the branch and bound procedure assigns values to decision variables in the following order: d, e, a, b and c. Since the fault is redundant, none of the 32 combinations of values for the five decision variables is a test. Therefore, the branch and bound procedure can require 32 backtracks before it establishes that no solution is possible. Decision variables a, b and c are part of sub-problem $S_1$, and variables d and e are part of sub-problem $S_2$. The decision order chosen implies that sub-problem $S_2$ is considered before $S_1$. The branch and bound procedure determines four solutions to sub-problem $S_2$. This is because $S_2$ has two decision variables d and e, and any combination of values for these variables is a solution to $S_2$. For each solution of $S_2$, the sub-problem $S_1$ is solved once. Therefore, the branch and bound procedure solves sub-problem $S_1$ four times. In contrast, a partitioning approach, in the worst case, has to examine only one solution for $S_1$ or $S_2$. Furthermore, if $S_1$ or $S_2$ has no solution, then the fault is redundant.

Figure 2:
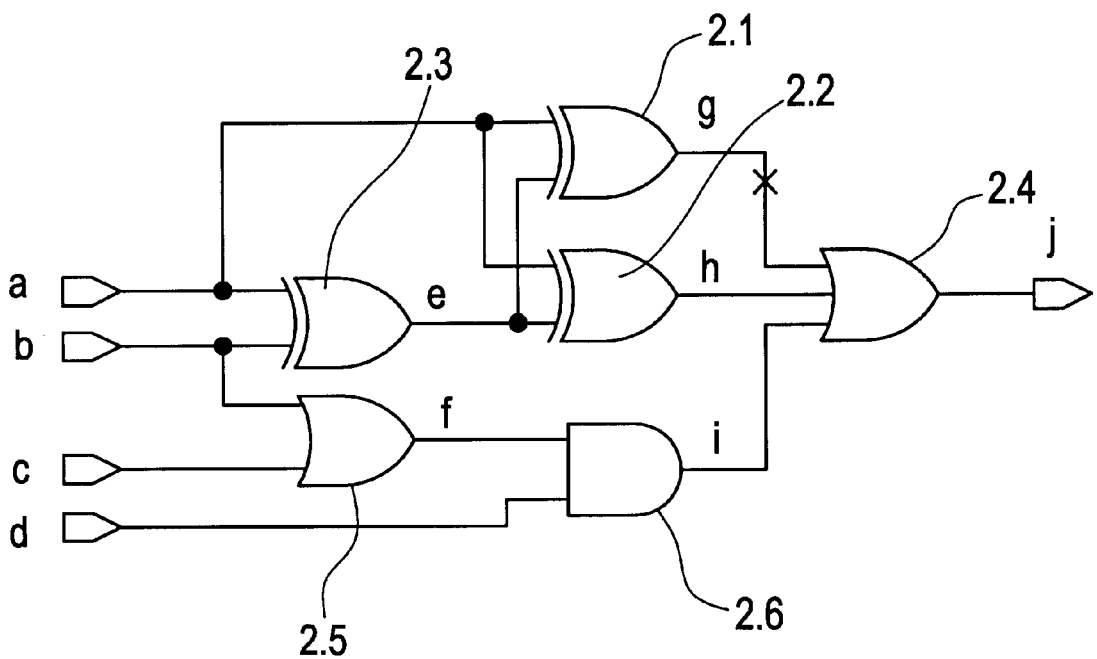
FIG. 2 shows an example of a circuit for illustrating on-line partitioning with dependent sub-problems.

Advantages of partitioning are obvious. However, in many cases, it is not possible to divide the problem into smaller, independent sub-problems. A second embodiment of the present invention is illustrated using an example circuit shown in FIG. 2. This circuit has six primary inputs and one primary output. This circuit has three exclusive-OR gates 2.1–2.3, two OR gates 2.4 and 2.5, and an AND gate 2.6. Consider the problem of generating a test vector for a stuck-at 0 fault on signal g. Since gate j is a dominator, the following signal assignments can be made as mandatory assignments in the fault-free circuit: g=1, and h=i=0.

The next step is to justify all these assignments by choosing appropriate values for primary inputs. The initial partition consists of signals {a, b, c, d, e, f, g, h, i, j}. The objective g=1 can be achieved by considering sub-circuit (sub-problem) $S_1$ consisting of signals {a, b, e}. Objective h=0 can be achieved by considering the sub-problem $S_2$ {a, b, e}. Objective i=0 can be achieved by considering the sub-problem $S_3=\{b, c, d, f\}$. Sub-problems $S_1$ and $S_2$ have common signals a, b and e. Value assignments to these signals must satisfy objectives of both sub-problems. Therefore, sub-problems $S^1$ and $S_2$ are not independent. Similar analysis shows that sub-problems $S_2$ and $S_3$ are also not independent. Therefore, it is not possible to statically sub-divide the original problem into independent sub-problems. In the second embodiment the sub-problems are not independent.

The two sub-problems $S_1$ and $S_3$ are dependent. However, for certain solutions of sub-problem $S_3$, the two sub-problems can be considered to be independent. For example, a possible solution for sub-problem $S_3$ is d=0. For this solution, sub-problem $S_3$ does not impose any constraints on values for signals b, c or f. Therefore, these variables can assume values to satisfy only objectives of sub-problem $S_1$. If no solution is possible for $S_1$, then we can safely conclude that no solution is possible for the original problem. For the present example, no combination of values for signals a and b can simultaneously satisfy the objectives g=1 and h=0.

If the solution b=c=0 for $S_3$ is considered, then sub-problems $S_1$ and $S_3$ are not independent. This is because, after solving $S_3$, sub-problem $S_l$ will be solved under the assumption that b=0. If no solution is now possible for $S_1$, then it cannot be concluded that no solution is possible for the original problem.

A key idea of on-line partitioning of the present invention is to divide the problem into smaller, possibly dependent sub-problems. Specific solutions found for sub-problems are analyzed to determine independence of sub-problems. Absence of a solution for an independent sub-problem implies absence of a solution for the original problem. However, if a specific solution for sub-problem $S_i$ does not render sub-problem $S_j$ to be independent, then absence of a solution for $S_j$ only suggests that a different solution be found for $S_i$.

Figure 21:
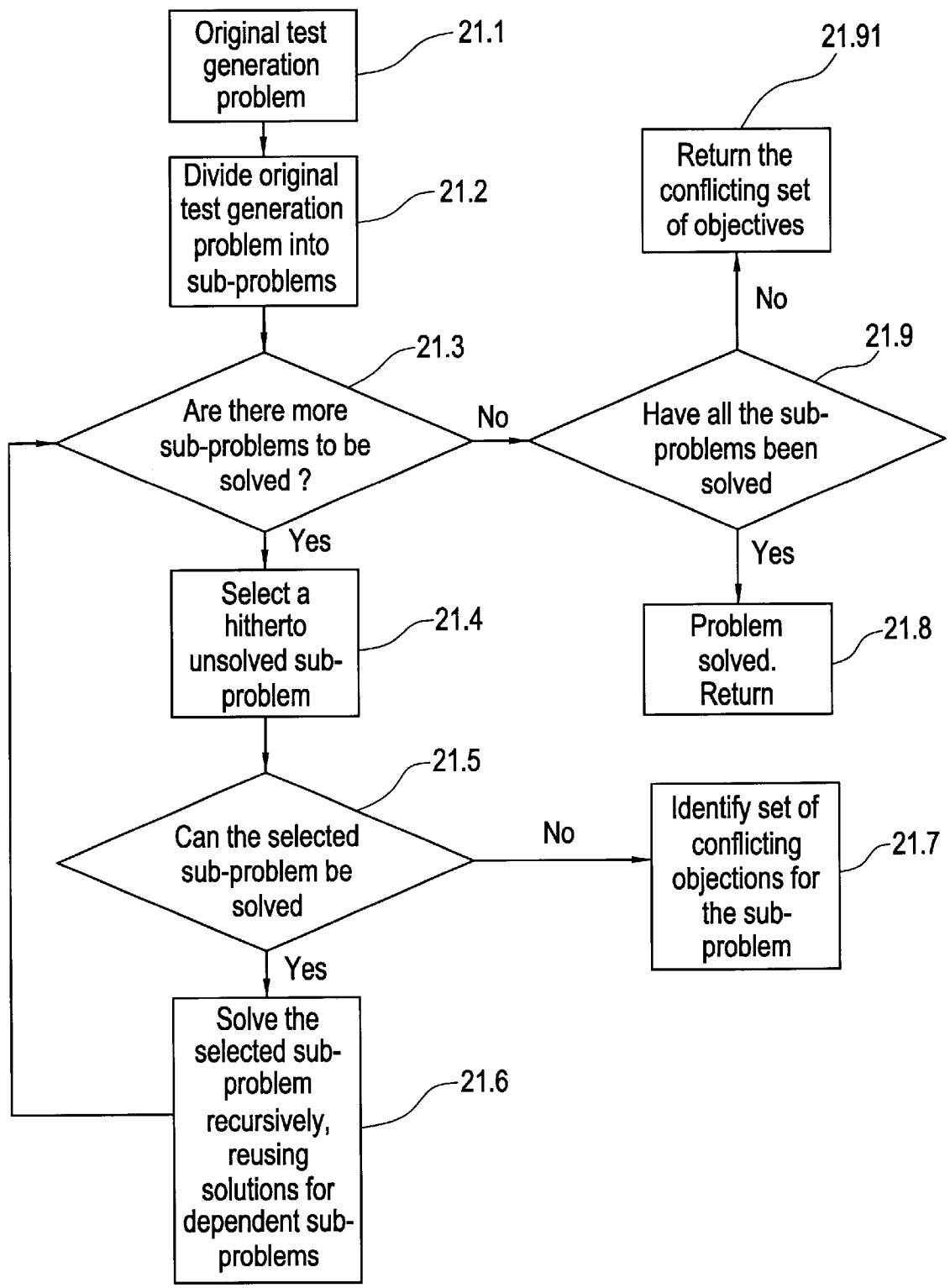
FIG. 21 shows a flowchart depicting a preferred embodiment for the method of solving a test generation problem according to the present invention.

IVB. A Preferred Embodiment of the On-line Partitioning Method for Generating Test Vectors A flowchart of a preferred embodiment of the on-line partitioning method is shown in FIG. 21. An original test generation problem 21.1 is divided into sub-problems in 21.2. For each sub-problem, the algorithm enters a loop in 21.3. If there are more sub-problems to be solved, an unsolved sub-problem is selected in 21.4. A test is performed in step 21.5 to see if the sub-problem can be solved. If the selected sub-problem cannot be solved, a set of conflicting objectives is identified in 21.7. If the sub-problem can be solved, the selected sub-problem is solved recursively. In the solution of this sub-problem solutions for dependent sub-problems are reused. In 21.9 a test is performed to determine if all the sub-problems have been solved. If all sub-problems have been solved, a solution is returned in 21.8, otherwise, a conflicting set of objectives are returned in 21.91.

Figure 3:
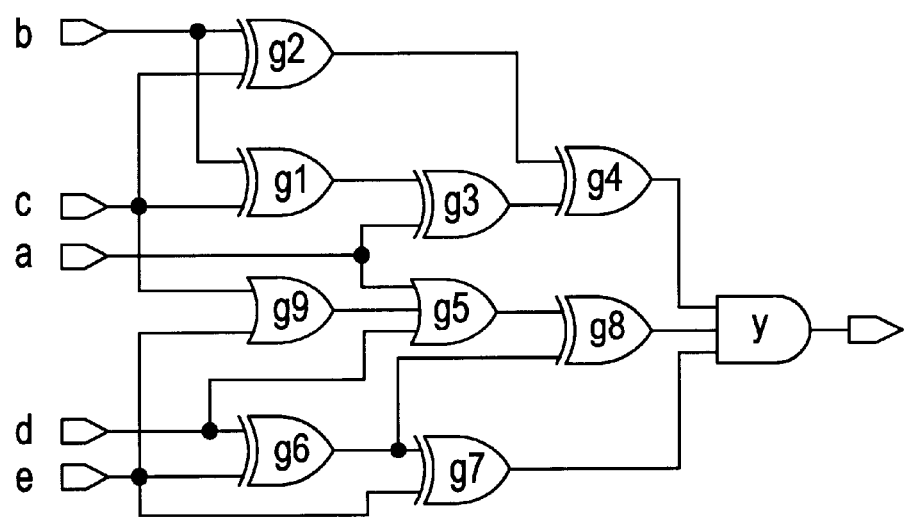
FIG. 3 shows an example circuit to illustrate a preferred embodiment of the on-line partitioning technique.

The generic framework of the new, on-line partitioning technique is captured in Algorithm 1 shown in FIG. 25. The main procedures of the algorithm are illustrated by considering an example. The example circuit shown in FIG. 3 is used to illustrate the preferred embodiment. This example circuit comprises exclusive-OR gates g1–g4, and g6–g8, OR gates g5 and g9 and an AND gate with output signal y. The primary inputs are a,b,c,d and e. Consider the problem of generating a test for a stuck-at-0 (s-a-0) fault on signal y. The set of decision variables for this problem are the primary inputs {a, b, c, d, e}. The functions NEXT_DECISION_VARIABLE, PARTITION NEXT_UNSOLVED_PARTITION and CONSISTENT_LABELING are searches that determine variable and partition ordering. They can be implemented in a variety of different ways. The actual implementations of these can impact running time of the algorithm drastically. Efficient implementations are described subsequently in this specification.

Figure 4:
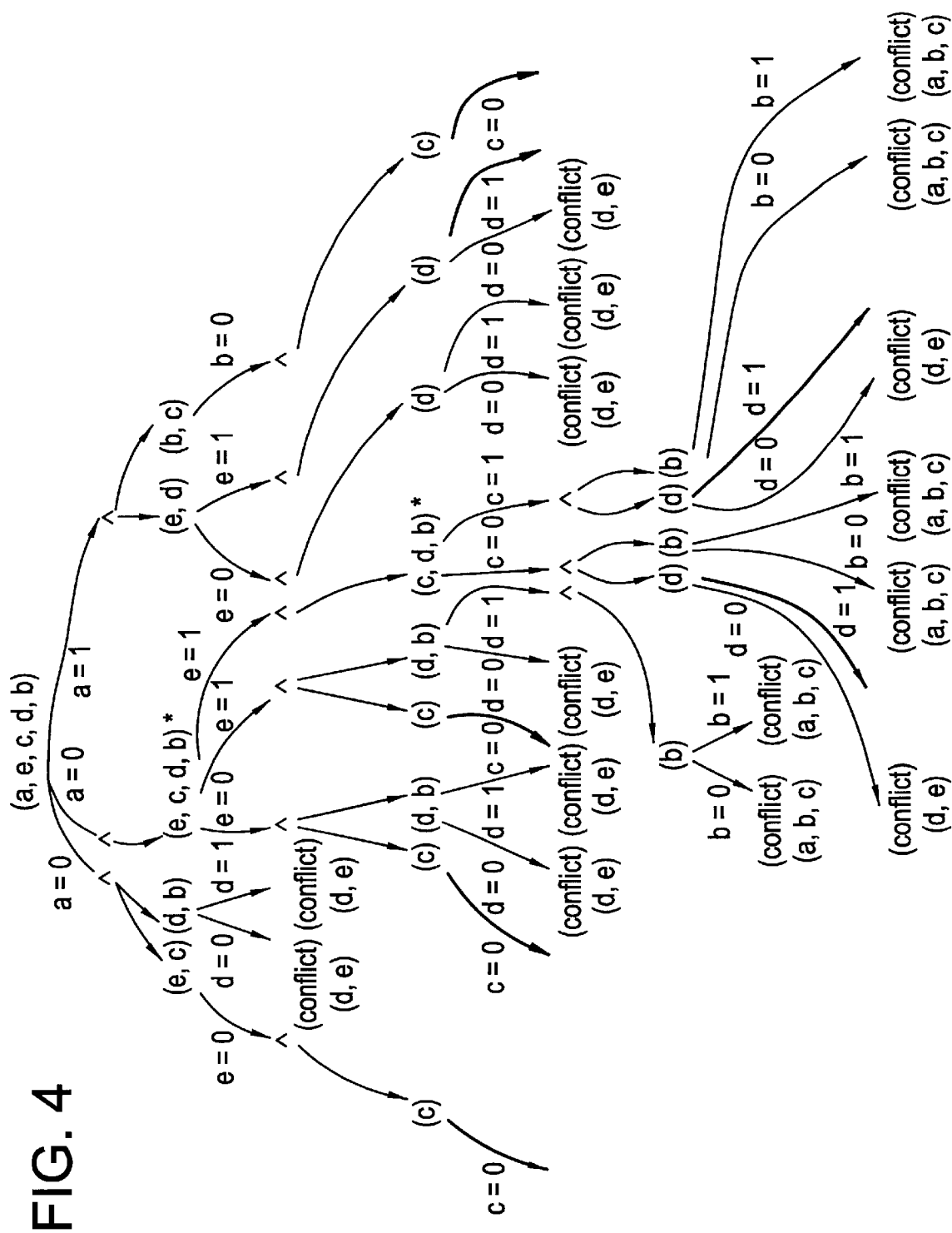
FIG. 4 illustrates an AND-OR tree to depict the behavior of the preferred embodiment of the on-line method shown in FIG. 25.

The behavior of Algorithm 1 can be graphically depicted as an AND-OR tree as in FIG. 4. Each node in the tree is either a partition denoted by a signal list enclosed in brackets, or a ˆ. The nodes denoted by partitions correspond to OR nodes. Here each of the child nodes represent the resulting problem when a signal of the partition is assigned a value. Here a solution needs to be found under any one branch. Each node denoted by a ˆ represents an AND node. The child nodes of such nodes denote partitions resulting from the parent decision. Here, all these partitions need to be solved for the problem to be solved. Arrows in thick font represent consistent labelings of the circuit. Arrows in thin font with the label conflict represent inconsistent signal labelings. The signal list in brackets associated with such labels indicate the list of assignments which are responsible for the inconsistency. This list is assumed to be returned by the function CONSISTENT_LABELING when it determines an inconsistency.

The initial call to on line solve is ONLINE_SOLVE(C={a, e, c, d, b}). Assume that the call to NEXT_DECISION_VARIABLE(C) at line 2 returns decision variable a. This is set to 0 and CONSISTENT_LABELING does not find any inconsistent signal assignments. The call to PARTITION at line 7 returns two partitions, {e, c} and {d, b}.

Assume that partition {e, c} is tried next. Therefore the next recursive call is ONLINE_SOLVE{e, c}. This partition is solved by setting e to 0 and then c to 0 in subsequent recursive calls. These are as in the left branch of the AND-OR tree in FIG. 4.

The partition C={d, b} is tried next. Assume that NEXT_DECISION_VARIABLE(C) returns decision variable d. Setting d to 0 results in CONSISTENT_LABELING discovering a conflict on g7 with the conflicting term being {d, e}. Control is transferred to line 20 and function VARIABLE_INDEPENDENT_PARTITION return false because the conflicting term involves d which is part of the partition. Control is transferred to line 4 and d is set to 1. The function CONSISTENT_LABELING returns an inconsistency on g8. The conflicting term is now again {d, e}. The function VARIABLE_INDEPENDENT_PARTITION returns F, because the conflicting term involves d which is a member of the current partition {d, b}. This is graphically depicted on the a=0, d=1 branch of the AND-OR tree in FIG. 4.

The test at line 4 returns NULL for $v_{value}$, because both values of variable d have been tried. This causes ONLINE_SOLVE{d, b} to return NO at line 10. Partition {d, b} is now seen to be dependent on partition {e, c}. Therefore, these partitions are merged at line 14. Control moves to line 9 wherein a solution for the newly merged partition is attempted. The call ONLINE_SOLVE(e,c,d,b) is made. This is an example of adaptive partitioning. The partition dependencies between {e, c} and {d, b} were not apparent when the partitioning decision was made. This dependency was discovered at a later stage, resulting in these partitions being merged. A solution is then attempted for the merged partition. The merge is indicated by an asterisk against the corresponding OR node in FIG. 4.

The next recursive call is ONLINE_SOLVE(C={e, c, d, b}). Assume that NEXT_DECISION_VARIABLE(C) at line 2 returns e. The signal e is then set to 0 (NEXT_VALUE(e) at line 4). The call to PARTITION(C={e, c, d, b}) at line 7 then returns two partitions {c} and {d, b}. Assuming {c} is selected next, variable c is set to 0 resulting in a consistent labeling. Partition {d, b} is attempted next. Both assignments to d result in inconsistent labelings. Both these calls to CONSISTENT_LABELING return conflict sets which are independent of c. Therefore failure of this partition is seen to be independent of its sibling partitions. This causes a backtrack to the parent partition wherein a value of 1 on signal e is tried next. This illustrates a case where the partitions are independent and all combinations of the constituent signals need not be tried to establish that no solution exists.

Setting e to 1 results in the same two partitions, {c} and {d, b}. Here, the failure of partition {d, b} is seen to depend on partition {c}. This results in the sibling partitions being merged. The next recursive call made is ONLINE_SOLVE (C={c, d, b}). Again this illustrates a case where the partition dependency between {c} and {d, b} was not known beforehand. The conflict throws up the dependency, which causes the dependent partitions to be merged.

The FIG. 4 depicts the remaining control flow. The merged partition {c, d, b} is tried next. The final solution is depicted in the rightmost branch of FIG. 4. The final signal assignments are a=1, b=0, c=0, d=1, e=1. This assignment of values constitutes a test for the s-a-0 fault on the output signal y.

IVC. The Most Preferred Embodiment Showing an Efficient Implementation of On-line Partitioning Method for Generating Test Vectors Algorithm 2, shown in FIG. 26, illustrates the most preferred embodiment showing an efficient implementation of the on-line partitioning concept. Specifically, the implementation illustrates determination and exploitation of solution-specific independence and re-use of, possibly dependent, partitions.

Algorithm 2 presents an efficient implementation of the generic on-line partitioning algorithm. Key data structures that are required for an efficient implementation of solution-specific independence, partition solution re-use and selection of a conflicting subset of the initial objectives are illustrated herein. The main data structure that is central to the partitioning concept is called partition$_{db}$ (database of partitions). This is implemented as a directed graph. Each node in the graph is implied by its parents. Source nodes are therefore decision points. Consequently, connected components in this graph correspond to related partitions in the circuit.

The algorithm uses the functions BACKTRACK and PARTITION_REUSE, which incorporate the crux of the new technique. Possible implementations of these functions are shown in algorithms 3 and 4, shown in FIGS. 27 and 28 respectively. Implementations of the remaining functions will be evident from context. They will be explained in the remaining part of this section.

The function NEXT_DECISION_VAR is used to pick decision variables. It picks variables depending on the contents of the Merged_partition$_{db}$. This database is assumed to be a tree based implementation of a disjoint set. The Merged_partition$_{db}$ contains sets of partitions which have been related by conflicts in the search process. The function NEXT_DECISION_VAR attempts to return an as yet unassigned variable which belongs to the same set as the current top of Stack. This ensures that successive variables are picked from the same partition whenever possible.

In this example, the function NEXT_DECISION_VAR defaults to a variable ordering of a, e, c, d, and b if the contents of Merged_partition$_{db}$ do not imply that a specific variable needs to be picked next.

The function CONSISTENT_LABELING is called to detect situations where a decision results in an inconsistent set of signal assignments in the circuit. For the purposes of this example, this function is assumed to be implemented purely as a set of simulation-justification passes over the circuit. All signal assignments found in the circuit by this function result in directed arcs being added to partition$_{db}$. The function ADD_TO_PARTITION_DB is called to accomplish this. These arcs indicate that a new set of partition dependency relationships have been discovered.

The function BACKTRACK is called whenever CONSISTENT_LABELING discovers an inconsistent set of signal assignments. This function implements conflict analysis. It uses the contents of the partition$_{db}$ to determine the maximal number of partitions that need to be re-solved to undo the current conflict. This is the call to DEPENDENT_PARTITIONS followed by the call to MOS_RECENT_PARTITION. It calls the function PARTITION_REUSE to reorganize Stack to incorporate this information.

The function PARTITION_REUSE determines partitions that are independent of the related partitions implied by the current conflict. It implements the two conditions that any partition needs to satisfy to be eligible for reuse. These will be explained in the example.

The function MERGE_PARTITIONS is called after each conflict in the circuit. This uses the currently conflicting set of partitions to update information in Merged_partition$_{db}$.

The functions SET_VALUE and UNSET_VALUE encapsulate the signal value data structure. The functions FIRST_VALUE and NEXT_VALUE are used to step through successive value assignments of the decision variables.

Consider again the problem of generating a test for the s-a-0 fault on signal y (FIG. 3). For this example, the test will require that signals g4, g8 and g7 must assume the value 1.

Each of the FIGS. 5–19 is in two parts. The left half of each figure shows the contents of the Stack data structure and the right half shows the state of the partition$_{db}$. Each figure from FIGS. 6–19 corresponds to one iteration of the outermost loop of Algorithm 2 shown in FIG. 26.

Figure 5:
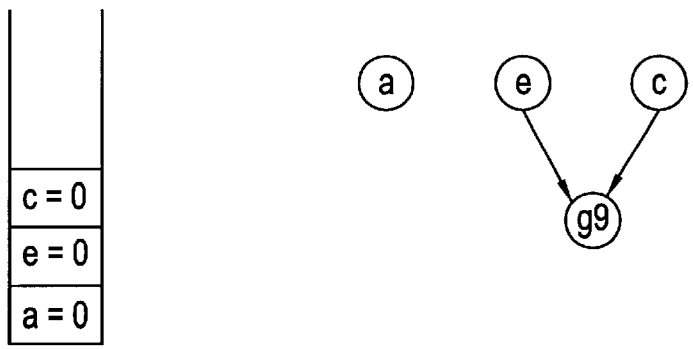
FIG. 5–FIG. 19 illustrates the contents of the stack and partitioned database after various steps in the implementation of a preferred embodiment of the test generation method of the present invention.

FIG. 5 shows the state of the data structures after the first three iterations of the outermost loop. In this case none of the three decisions results in a conflict. The run path during each of these iterations is lines 4,5,6,7,19,20, and 21 in Algorithm 2. The call to CONSISTENT_LABELING after setting signal e to 0 resulted in g9 being assigned to a 0. This resulted in partition$_{db}$ being augmented with arcs from e and c to g9.

Figure 6:
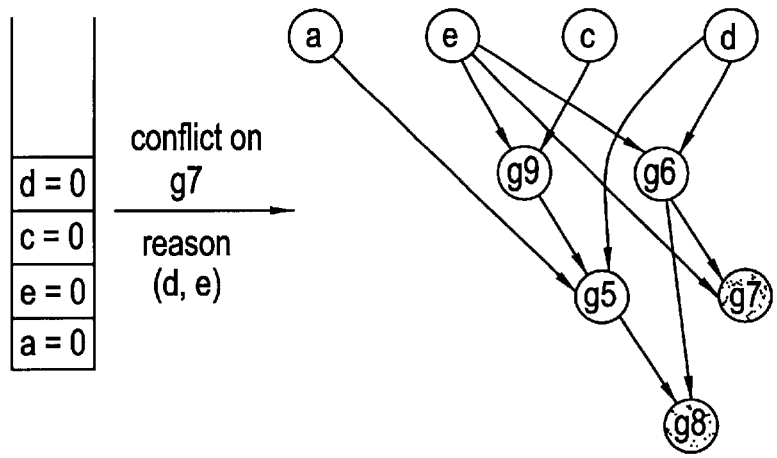

The next call to NEXT_DECISION_VARIABLE returns d due to the variable ordering. Here d is set to 0 (FIRST_VALUE) in line 6. The call to CONSISTENT_LABELING then determines signals g5, g6, g7, g8 by simulation. The partition database is augmented to indicate these fixations. FIG. 6 indicates the corresponding state of Stack and partition$_{db}$. Assignment of g7 and g8 to 0 results in an inconsistent set of signal assignments because the mandatory assignments indicate that g7 and g8 need to be 1. Most implementation systems stop at the first determined conflict. For the purposes of this example, it is assumed that the conflict first detected is on g7. The variable conflict is set to YES by consistent labeling. Also conflicting_values is set to g7. Control is transferred to the routine BACKTRACK. The call to DEPENDENT_PARTITIONS in line 4 of BACKTRACK returns {d, e}. This is because, from the partition database it is clear that e and d are the only two partitions required to determine the value of g7. The call to MOST_RECENT_PARTITION returns d and control is transferred to PARTITION_REUSE. In this case since mrp is the same as top of Stack, control is transferred to line 17 of PARTITION_REUSE. This causes the value of d to be unset in the value table and the arcs corresponding to d in partition$_{db}$ to be removed. Control returns to line 16 of Algorithm 2. This results in {d, e} being added to Merged_.partition$_{db}$. Line 19 sets d to NEXT_VALUE which is 1. Line 20 results in an arc from e to d being added in partition$_{db}$. This indicates that the value of partition d is now determined completely by partition e.

Figure 7:
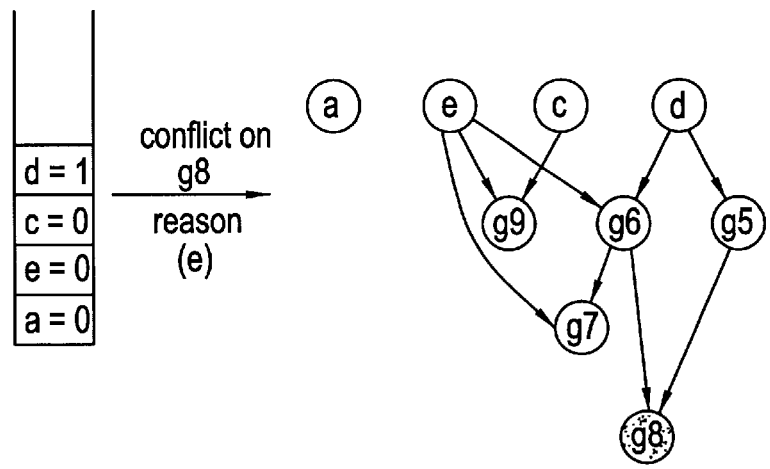
Figure 8:
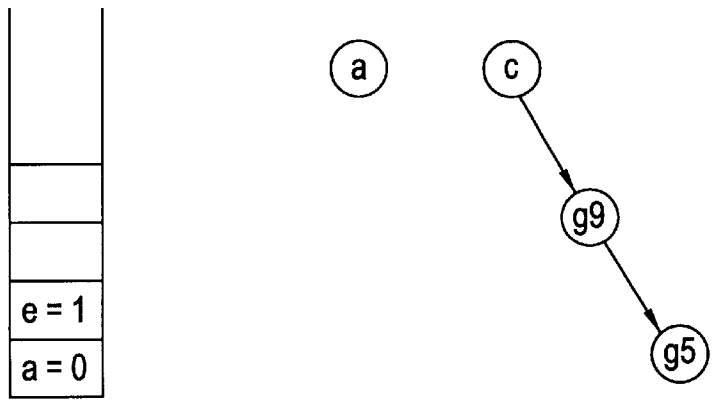
Figure 9:
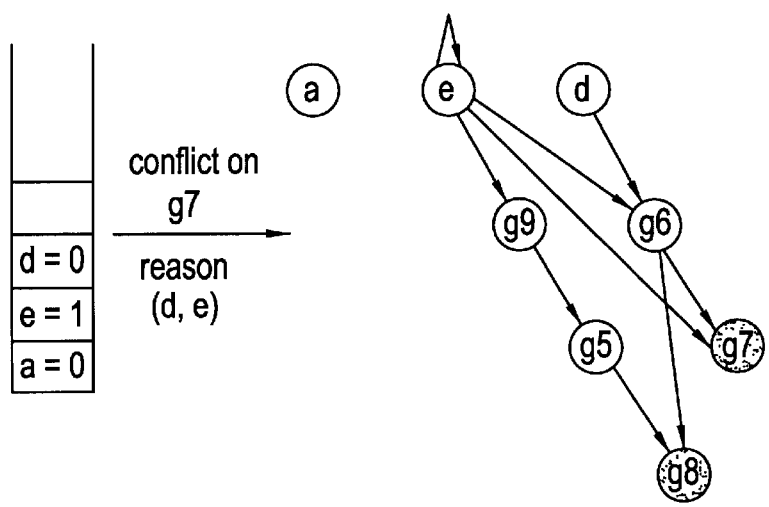
Figure 10:
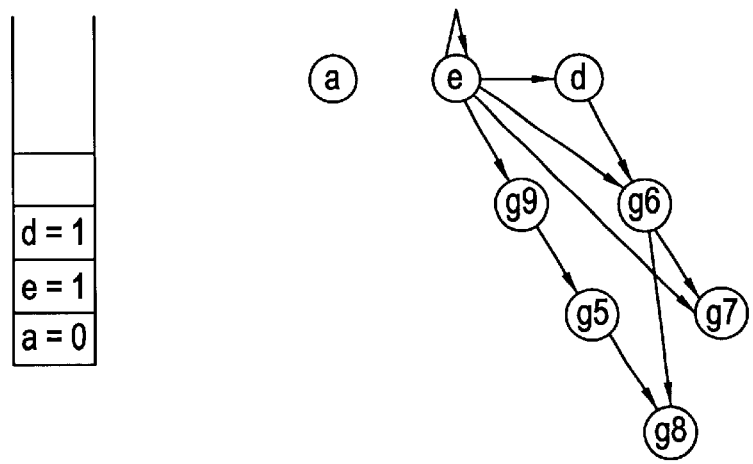
Figure 11:
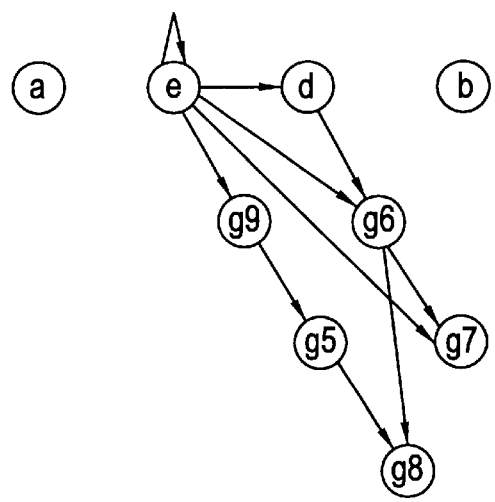
Figure 12:
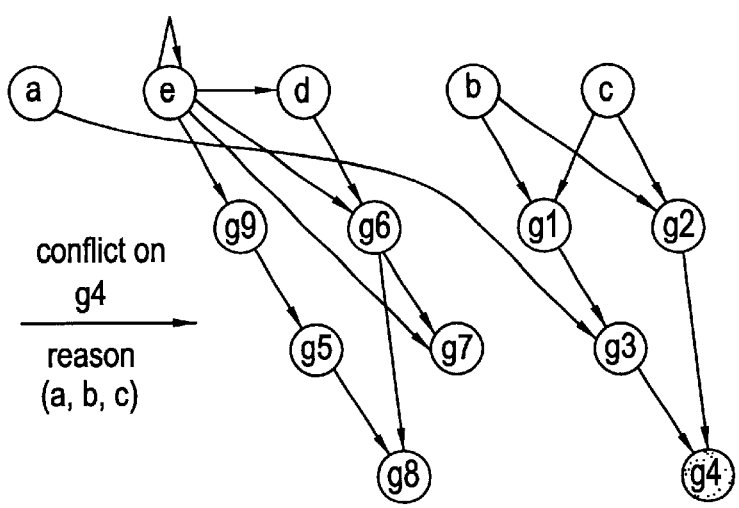
Figure 13:
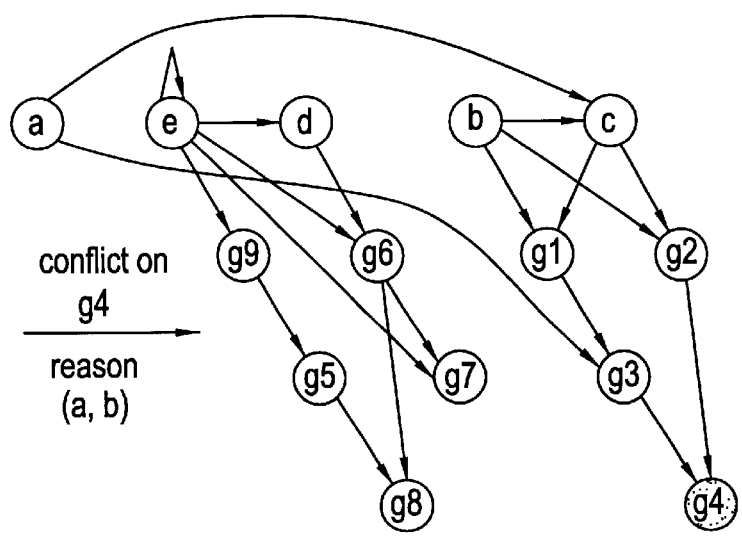
Figure 14:
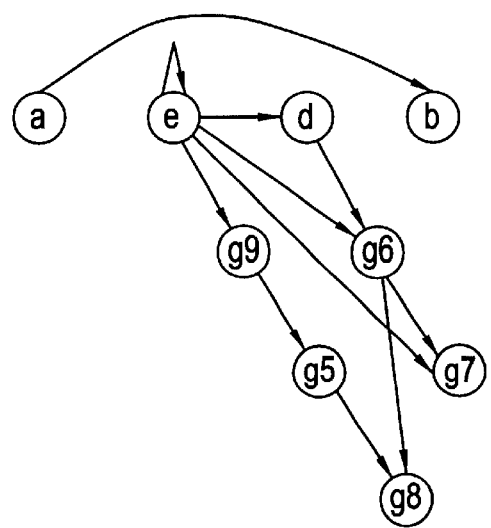
Figure 15:
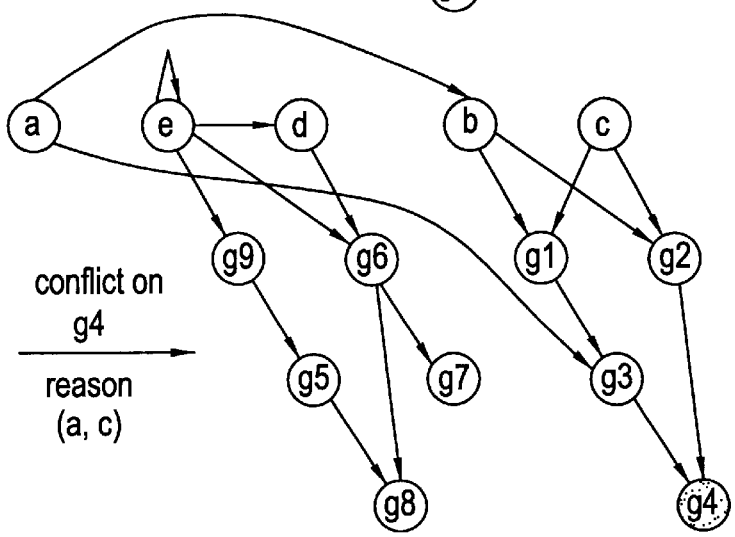

Similar control flow now augments partition$_{db}$ as in FIG. 7. This time a CONSISTENT_LABELING determines a conflict on signal g8. The function DEPENDENT_PARTITIONS in this case returns e. PARTITION_REUSE is called with mrp=e. Control reaches line 9 with partition_list {d, c}. The set delete_set contains e. Each element of partition_list is then checked at line 10 to determine if it can be reused. The test CHILD compares each with each element of delete_set to determine if any fixations have been derived by the pair. In the directed graph implementation of the partition$_{db}$, this could be a depth first traversal from each node of the pair. No such fixations should exist if the partition being examined is independent of the partition relationships implied by the current conflict. The test ANCESTOR checks to determine if any of the ancestors of w in the partition$_{db}$ are currently in the delete_set. No ancestor should exist in the delete_set for a partition to be independent. In this case, partition c cannot be reused because it had combined with e to produce fixation g9. (i.e. CHILD({c, e})=g9). Partition d cannot be reused because ANCESTOR(d)==e from the partition$_{db}$. Therefore, d, c and e are unset and deleted from the partition database partition$_{db}$. The variable e is pushed back on stack at line 20 and control is transferred to line 13 of Algorithm 2. At line 22 of Algorithm 2, the partition$_{db}$ and the stack are as in FIG. 8.

The next call to NEXT_DECISION_VARIABLE now uses the fact that the partition set {d, e} exists in the Merged partition$_{db}$. Since top of Stack is now e, NEXT_DECISION_VARIABLE returns d because d and e were dependent partitions previously. Here, a change in the variable ordering has been enforced by partition analysis. The default variable ordering would have picked c instead of d. The variable d is set to 0 (FIRST_VALUE) and the call to CONSISTENT_LABELING causes partition$_{db}$ to be augmented as in FIG. 9. Conflicts are detected on g7 and g8. Detection of either results in dep_partitions being set to {d, e} from the call to BACKTRACK. The call at line 20 in Algorithm 2 results in an arc from e to d in partition$_{db}$. The call to CONSISTENT_LABELING results in partition$_{db}$ appearing as in FIG. 10.

Figure 16:
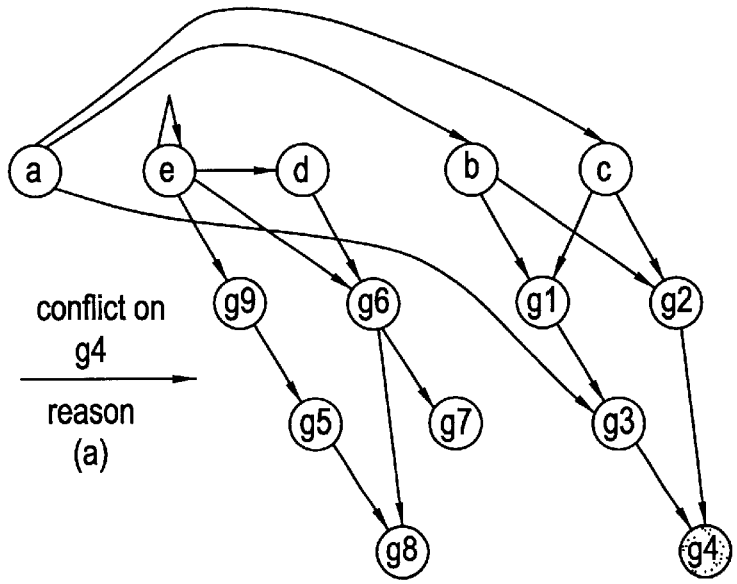
Figure 17:
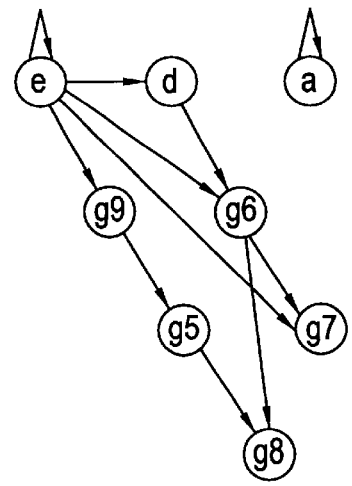
Figure 18:
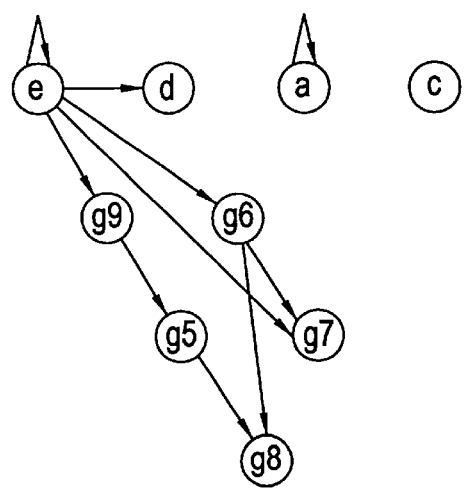
Figure 19:
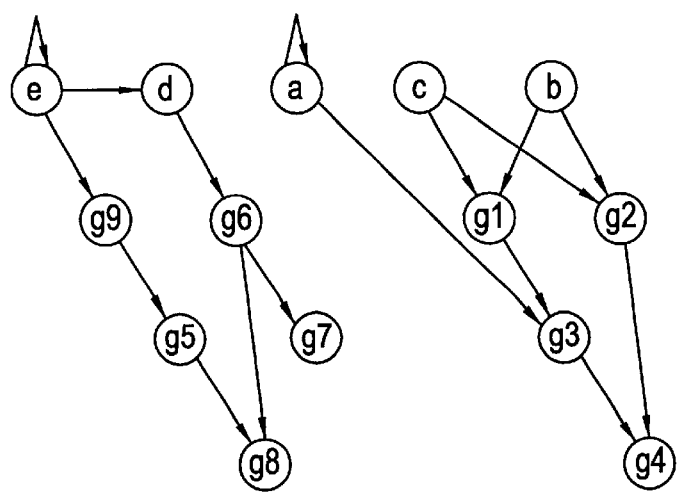
Figure 20:
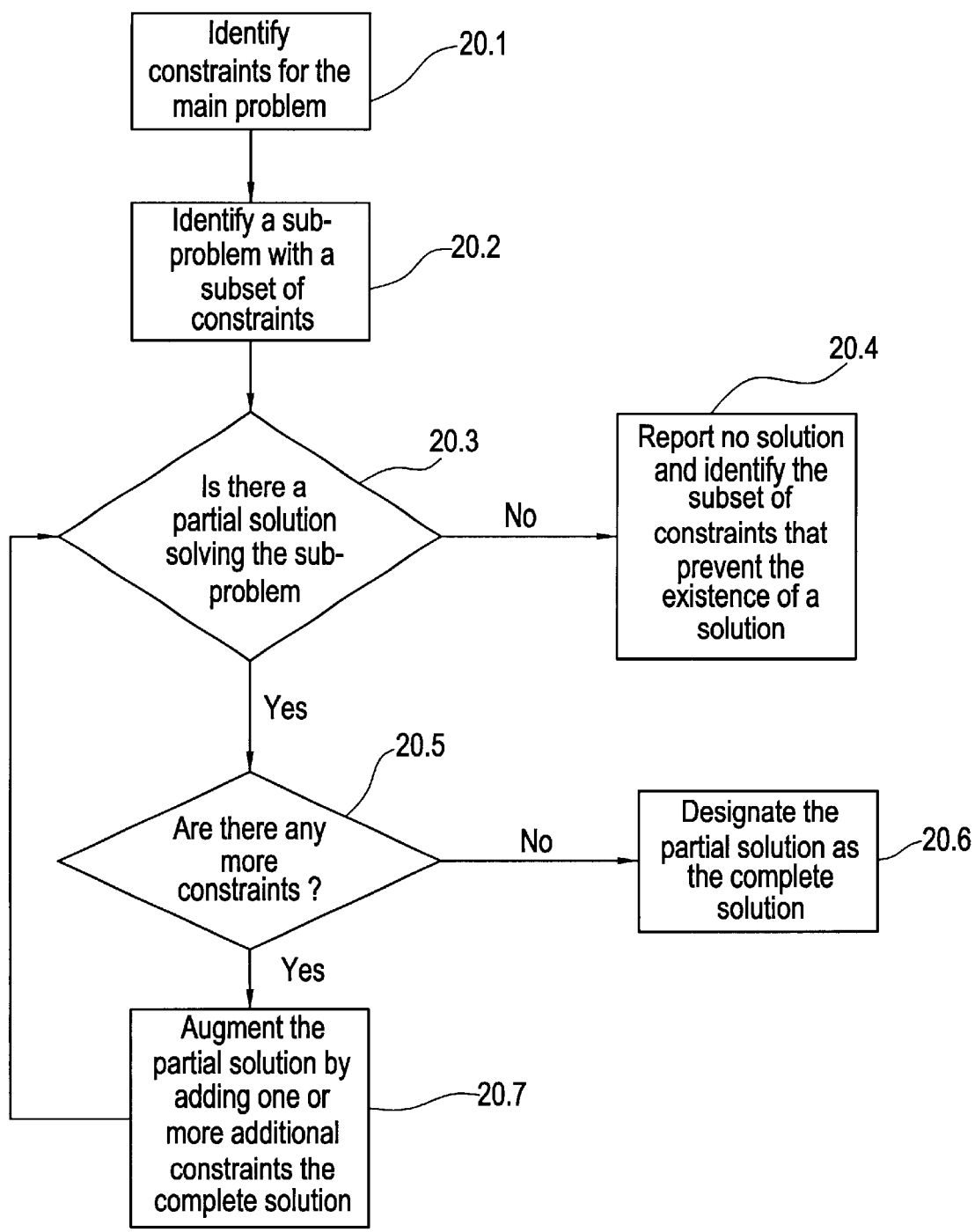
FIG. 20 shows a flowchart depicting an on-line method of solving a problem.

FIGS. 11 through 16 illustrate the on-line partitioning process by adding variables b and c on the Stack. The function CONSISTENT_LABELING, called after setting c to 1 detects a conflict on g4. This is illustrated in FIG. 16. The corresponding call to backtrack finds mrp to be {a}. The function PARTITION_REUSE is called. The variable delete_set is initialized to a at line 2 of PARTITION_REUSE and partition_list contains {e, d, b, c} at line 9. Variables c and b fail the ANCESTOR test and therefore have to be backed up. The variables d and e pass both tests and can therefore be reused. At the end of the call to PARTITION_REUSE, Stack appears as in FIG. 17. Conventional branch and bound solution method will undo the effects of both d and e before trying a new value on a. However, in the on-line partitioning method, implications of d and e are not undone. FIGS. 18 and 19 illustrate the next two iterations of the outermost loop of Algorithm 2. Decision variables c and b are picked. No conflicts are detected and a valid assignment of values for detecting the fault is obtained in FIG. 19.

IVD. A Test Generation System

Figure 22:
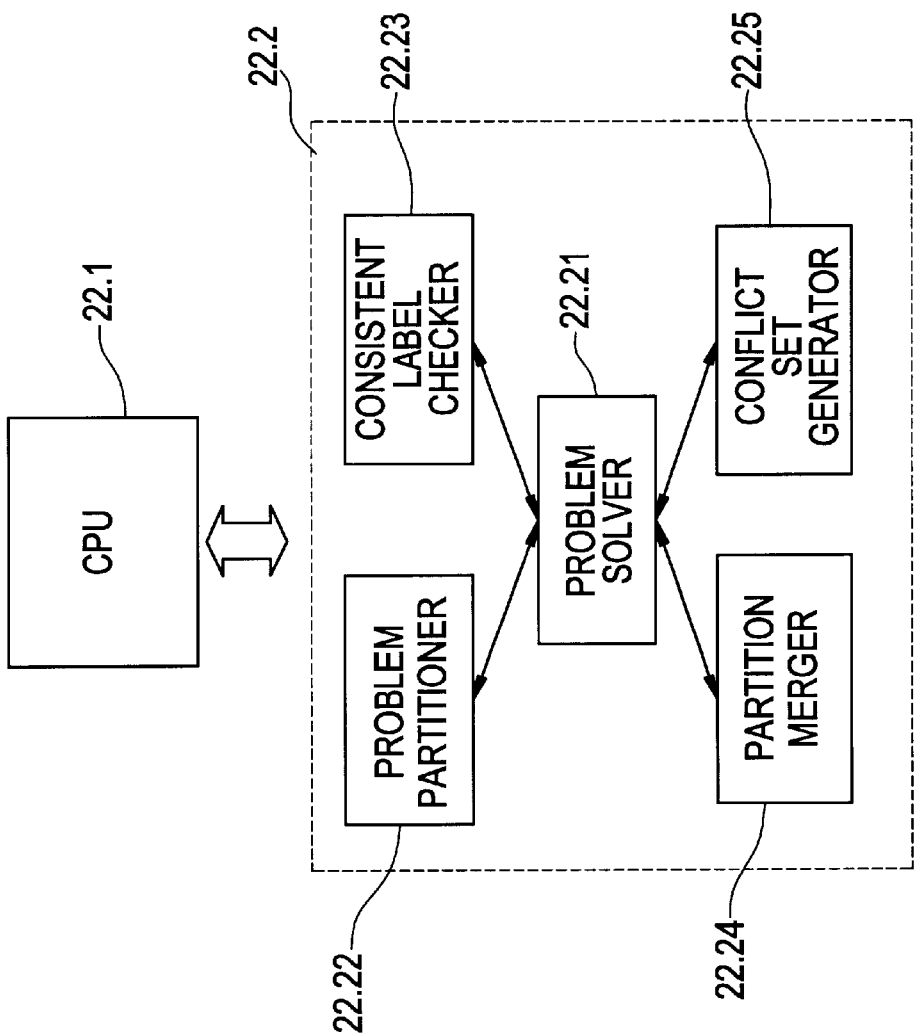
FIG. 22 shows a preferred embodiment of a test generation system according to the present invention.

A preferred embodiment of a test generation system is shown in FIG. 22. This test generation system comprises a computer. It should be noted that the computer could be any kind of computer including a PC, mainframe, a workstation or a remote computer on a network. This computer has a CPU 22.1 and memory 22.2. The memory contains instructions that enable the computer to implement the various components of the test generation system The components of the test generation system include a test generation problem solver 22.21 that recursively solves test generation problems wherein solutions for sub-problems are reused. A problem partitioner 22.22 receives test generation problems and partitions said test generation problems into sub-problems. These sub-problems may be dependent. While these sub-problems may be dependent they may have solution-specific dependence. A consistent label checker 22.23 receives the test generation problem from the problem solver and determined if there is consistent labeling. A partition merger 22.24 merges a subset of sub-problems if no solution exists for the subset of sub-problems and if said subset of sub-problems are dependent. Finally a conflict set generator generates a conflict set of objectives that prevents a specific sub-problem from having a solution.

IVE. A Test Generation Computer Program Product.

An important aspect of the present invention is computer program product. This program product includes a compute readable medium with instructions said instruction enabling a computer to solve a test generation problem. It should be noted that the computer readable medium includes any fixed media including, but not limited to, floppy disk, hard disk, CD, chips, tapes, cartridges with Ics, etc. The computer readable media also includes instructions transmitted through a network or downloaded from the internet. The instructions include a test generation problem solver code. The problem solver code enables the computer to recursively solve the test generation problem. The problem solver is capable of reusing solutions for sub-problems. A problem partitioner code enables the computer to receive the test generation problem and partition said test generation problems into sub-problems. These sub-problems may be dependent while having solution-specific dependence.

A consistent label checker code enables the computer to receive the test generation problem from the problem solver and determine if there is consistent labeling. A partition merger code enables the computer to merge a subset of sub-problems if no solution exists for said subset of sub-problems and if the subset of sub-problems are dependent. A conflict set generator code enables a computer to generate a conflict set of objectives that prevents a specific sub-problem from having a solution.

IVF. Experimental Results

The online partitioning techniques described in the earlier sections have been implemented as part of a transitive closure based ATPG system. Tables 1 and 2, shown in FIGS. 23 and 24, respectively, indicate performance of the ATPG system augmented with our on line partitioning techniques. The columns indicated as Baseline system indicate the performance of the ATPG system without these new techniques.

The column labeled Total indicates the total number of faults for which test generation was attempted. Column Solved indicates the number of faults for which the ATPG system could either generate a test or classify as UNTESTABLE. Column Bt shows the total number of backtracks incurred by the ATPG system while attempting to classify faults within each circuit. Column Time is the total time spent on the circuit by the ATPG system. Each fault was given a time limit of 1 second. All experiments were conducted on a Solaris system with a 300 MHz SPARC processor. The last three columns indicate the percent improvement of the new techniques over the baseline system. Table 1 shows results on ISCAS circuits. Table 2 indicates results on some production circuits. These circuits range in size from 10K to 400K gates.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of solving a test generation problem for sequential circuits comprising:

a) recursively dividing an original test generation problem into smaller sub-problems, wherein said sub-problems may be dependent while one or more of said dependent sub-problems may have solution-specific independence;

b) finding solutions for said sub-problems;

c) reusing solutions for dependent sub-problems, whenever the dependent sub-problems enjoy solution-specific independence; and d) identifying a minimal subset of conflicting objectives if a sub-problem that has to be solved to achieve multiple objectives has no solution.

2. A method of generating test vectors for testing a sequential circuit, said method comprising:

a) identifying a test generation problem;

b) selecting a next decision variable;

c) selecting a next value for the decision variable of step b;

d) checking to see if the value selected in step b leads to consistent labeling and returning a conflict set if consistent labeling does not exist;

e) performing the following sub-steps if said checking in step d finds consistent labeling:
   i) partitioning the test generation problem into sub-problems and recursively applying the method of this claim to each of said sub-problems;
   ii) merging dependent partitions if no solution exists for a current sub-problem and if said dependent partitions exist;
   iii) going to stop c if no solution exists for a current sub-problem and if dependent partitions do not exist;

f) adding variables causing inconsistent labeling if said variables are not part of current partition if said checking leads to inconsistent labeling;

g) repeating steps c–f for all values of selected variable;

h) repeating steps b–g for all variables; and i) returning if solution is found or returning an identified conflict set.

3. A method of solving a problem, said method comprising:

a) recursively dividing the problem into smaller sub-problems, wherein said sub-problems may be dependent while one or more of said dependent sub-problems may have solution-specific independence;

b) finding solutions for said sub-problems;

c) reusing solutions for dependent sub-problems, whenever the dependent sub-problems enjoy solution-specific independence; and d) identifying a minimal subset of conflicting objectives if a sub-problem that has to be solved to achieve multiple objectives has no solution.

4. A test generation system comprising a computer, said computer having a cpu and memory, said memory comprising instructions capable of implementing components of said system, said components comprising:

a test generation problem solver for recursively solving test generation problems wherein solutions for sub-problems are reused;

a problem partitioner for receiving test generation problems and partitioning said test generation problems into sub-problems wherein said sub-problems may be dependent and wherein said sub-problems may have solution-specific dependence;

a consistent label checker for receiving the test generation problem from the problem solver and determining if there is consistent labeling;

a partition merger for merging a subset of sub-problems if no solution exists for said subset of sub-problems and if said subset of sub-problems are dependent; and a conflict set generator for generating a conflict set of objectives that prevents a specific sub-problem from having a solution.

5. A computer program product including a compute readable medium with instructions, said instructions enabling a computer to solve a test generation problem, said instruction comprising:

a test generation problem solver code for enabling the computer to recursively solve the test generation problem, wherein solutions for sub-problems are reused;

a problem partitioner code for enabling the computer to receive the test generation problem and partitioning said test generation problems into sub-problems wherein said sub-problems may be dependent and wherein said sub-problems may have solution-specific dependence;

a consistent label checker code for enabling the computer to receive the test generation problem from the problem solver and determine if there is consistent labeling;

a partition merger code for enabling a computer to merge a subset of sub-problems if no solution exists for said subset of sub-problems and if said subset of sub-problems are dependent; and a conflict set generator code for enabling a computer to generate a conflict set of objectives that prevents a specific sub-problem from having a solution.

* * * * *